United States Patent [19]

Kirschner et al.

[11] Patent Number: 4,706,215
[45] Date of Patent: Nov. 10, 1987

[54] DATA PROTECTION SYSTEM FOR ELECTRONIC POSTAGE METERS HAVING MULTIPLE NON-VOLATILE MULTIPLE MEMORIES

[75] Inventors: Wallace Kirschner, Trumbull, Conn.; Easwaran C. N. Nambudiri, East Meadow, N.Y.; Douglas H. Patterson, Norwalk, Conn.

[73] Assignee: Pitney Bowes Inc., Stamford, Conn.

[21] Appl. No.: 643,111

[22] Filed: Aug. 22, 1984

[51] Int. Cl.⁴ .............................................. G06F 7/12
[52] U.S. Cl. .................................... 364/900; 364/466
[58] Field of Search ... 364/200MS File, 900 MS File; 365/228, 229

[56] References Cited

U.S. PATENT DOCUMENTS

| | | | |
|---|---|---|---|
| 3,516,068 | 6/1970 | Wang | 364/900 |
| 3,859,638 | 1/1975 | Hume | 365/229 |
| 3,937,937 | 2/1976 | McVey | 364/200 |
| 4,096,560 | 6/1978 | Footh | 364/200 |
| 4,306,299 | 12/1981 | Check, Jr. et al. | 364/900 |
| 4,307,455 | 12/1981 | Juhasz et al. | 364/900 |
| 4,335,434 | 6/1982 | Baumann | 364/464 |
| 4,564,922 | 1/1986 | Muller | 364/900 |
| 4,578,774 | 3/1986 | Muller | 364/900 |

Primary Examiner—Archie E. Williams, Jr.
Assistant Examiner—Emily Yue Chan
Attorney, Agent, or Firm—Michael J. DeSha; David E. Pitchenik; Melvin J. Scolnick

[57] ABSTRACT

A method and associated apparatus is provided for protecting the accounting data stored in an electronic postage meter having multiple non-volatile memories for the storage of accounting data, including the steps of and associated apparatus for providing a first non-volatile memory; writing postage transactions accounting data into the first non-volatile memory in real time during each trip cycle of the meter; providing a second non-volatile memory; writing postage transaction accounting data into the second non-volatile memory only during the power cycle of the meter; and disabling the first non-volatile memory when the meter enters a power down cycle to prevent any further writing of data into the first non-volatile memory. Advantageously, the first non-volatile memory is clamped to ground potential during the power down cycle.

14 Claims, 3 Drawing Figures

DATA PROTECTION SYSTEM FOR ELECTRONIC POSTAGE METERS HAVING MULTIPLE NON-VOLATILE MULTIPLE MEMORIES

BACKGROUND OF THE INVENTION

The present invention relates to electronic postage meters, and more specifically to a data protection system for electronic postage meters having multiple non-volatile memories (NVMs).

Various electronic postage meter systems have been developed, as for example the systems disclosed in U.S. Pat. No. 3,978,457 for Microcomputerized Electronic Postage Meter Systems, U.S. Pat. No. 3,938,095 for Computer Responsive Postage Meter, European patent application No. 80400603.9, filed May 5, 1980 for Electronic Postage Meter Having Improved Security and Fault Tolerance Features, U.S. Pat. No. 4,301,507, for Electronic Postage Meter Having Plural Computing Systems, and copending application Ser. No. 447,815, filed Dec. 8, 1982, for Stand-Alone Electronic Mailing Machine.

Generally, electronic postage meters include some form of non-volatile memory capability to store critical postage accounting information. This information includes, for example, the amount of postage remaining in the meter for subsequent printing and the total amount of postage already printed by the meter. Other types of accounting or operating data may also be stored in the non-volatile memory, as desired.

However, conditions can occur in electronic postage meters where information stored in non-volatile memory may be lost. A total line power failure or fluctuation in voltage conditions can cause the microprocessor associated with the meter to operate erratically and either cause erasure of data or the writing of spurious data in the non-volatile memory. The erasure of data or the writing of spurious data in the non-volatile memory may result in a loss of critical accounting information. Since the accounting data changes with the printing of postage and is not permanently stored elsewhere, there is no way to recapture or reconstruct the lost information. Under such circumstances, it is possible that a user may suffer a loss of postage funds.

To minimize the likelihood of a loss of information stored in the non-volatile memory, various approaches have been adopted to insure the high reliability of electronic postage meters. It is known from aforementioned U.S. Pat. No. 3,978,457 and aforementioned copending application Ser. No. 447,815 to provide a microprocessor controlled electronic postage meter having memory architecture which includes a temporary storage memory for storing accounting data reflecting each meter transaction and a non-volatile memory to which the accounting data is transferred during the power down cycle of the meter. With such a memory architecture it is known to provide a memory protection circuit for transferring data from the temporary memory to the NVM during the power down cycle, see U.S. Pat. No. 4,445,198, entitled, Memory Protection Circuit For An Electronic Postage Meter.

Another approach for preserving the stored accounting data has been the use of redundant non-volatile memories. One such redundant memory system is disclosed in patent application Ser. No. 343,877, filed Jan. 29, 1982, in the name of Frank T. Check, Jr., and entitled Electronic Postage Meter Having Redundant Memory. With such redundant memory system the two redundant non-volatile memories are interconnected with a microprocessor by way of completely separate data and address lines to eliminate error conditions. The data may be applied to the memories simultaneously or sequentially at different times. Such a system minimizes the possibility of non-detectable and/or non-correctable errors resulting from transients.

Another redundant memory system is disclosed in the aforementioned European patent application No. 80400603.9. In such patent application, accounting data is written into each of the two non-volatile memories, designated BAMs, twice during each postage meter transaction, once in temporary form and once in permanent form to minimize the loss of accounting data during microcomputer failure. During a power failure a microprocessor sets a pair of redundant flip-flops to provide a first signal, after a predetermined time period to allow completion of any ongoing BAM register updates, which signal inhibits further writing in the BAMs and a second signal, after another predetermined time period, which signal inhibits further operation of the microprocessor. These signals are generated in a particular time sequence in an effort to prevent spurious operation during the power down cycle.

Another system which includes multiple non-volatile memories is disclosed in copending patent application Ser. No. 643,219, filed on even date herewith, entitled Non-Volatile Memory System With Real Time And Power Down Data Storage Capability For An Electronic Postage Meter. In this system a first NVM stores accounting data of each postage transaction in real time during each trip cycle, while a second NVM has postage transaction accounting data transferred from a volatile memory and written into the second NVM only during a power down cycle of the meter. However, with such a non-volatile memory system it is advantageous to inhibit further writing in the first or real time NVM once a power down cycle begins.

SUMMARY OF THE INVENTION

It is an object of the present invention to provide a data protection system for an electronic postage meter having multiple NVMs.

It is a further object of the present invention to provide a data protection system for a real time NVM during a power down cycle of the meter.

It is a still further object of the present invention to provide a power down protection circuit for disabling a real time NVM during the power down cycle of an electronic postage meter.

Briefly, in accordance with the present invention, a method and associated apparatus is provided for protecting the accounting data stored in an electronic postage meter having multiple NVMs for the storage of accounting data, including the steps of and associated apparatus for providing a first non-volatile memory; writing postage transaction accounting data into the first non-volatile memory in realtime during each trip cycle of the meter; providing a second non-volatile memory; writing postage transaction accounting data into the second non-volatile memory only during the power down cycle of the meter; and disabling the first non-volatile memory when the meter enters a power down cycle to prevent any further writing of data into the first non-volatile memory. Advantageously, the first NVM is clamped to ground potential during the power down cycle.

3

Other objects, aspects and advantages of the present invention will be apparent from the detailed description considered in conjunction with the drawings, as follows:

DETAILED DESCRIPTION

Figure 1:
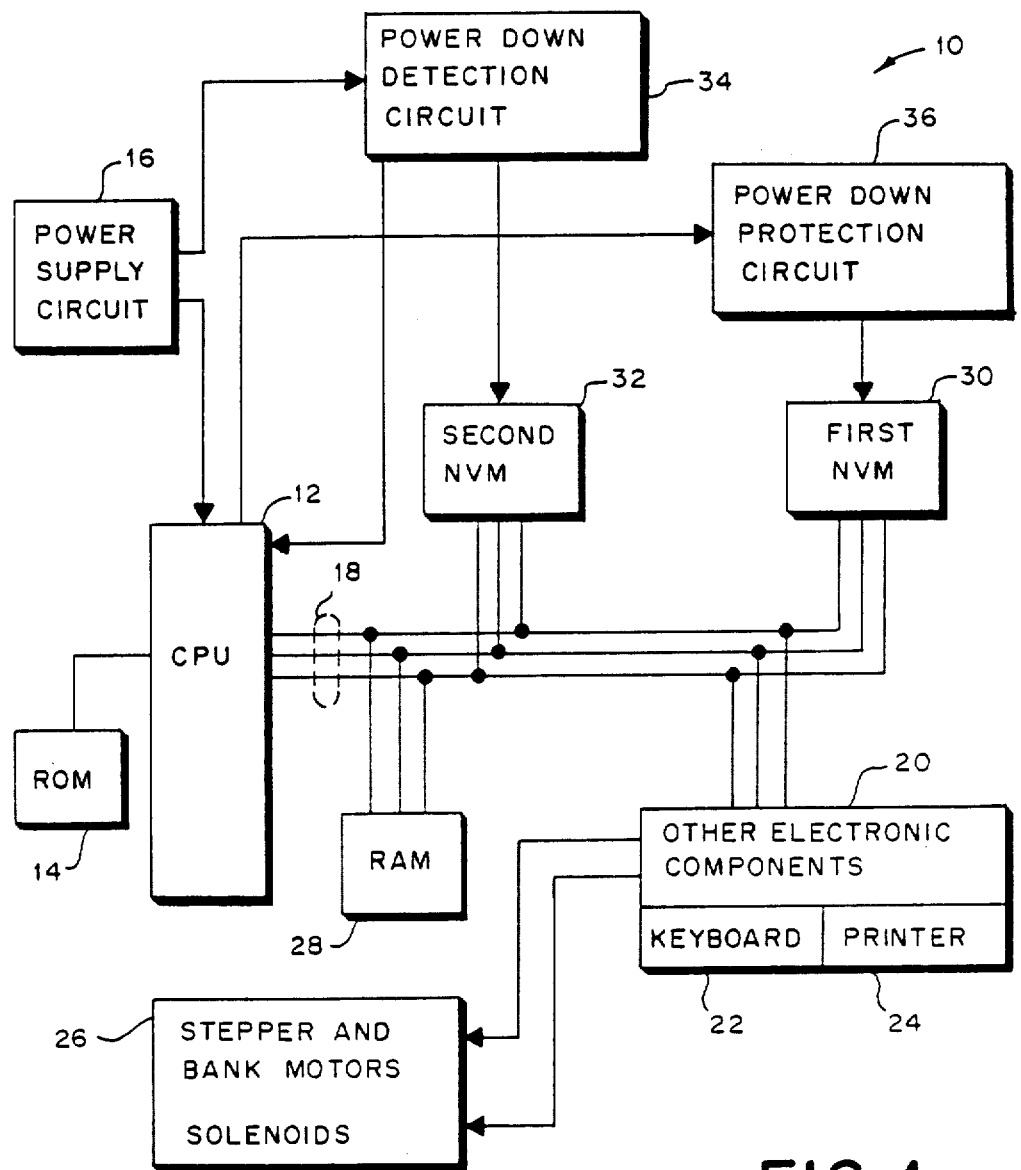
FIG. 1 is a block diagram of one embodiment of the data protection system in accordance with the present invention.

Referring to FIG. 1, a data protection system for an electronic postage meter in accordance with the present invention is generally illustrated at 10. Preferably, the general architecture of the electronic postage meter is similar to that disclosed in the aforementioned copending patent application Ser. No. 447,815, modified as disclosed in FIG. 1. Specifically a central processing unit 12, in the form of a microprocessor, e.g., a Model 8085A microprocessor, is operated under program control in accordance with the programs stored in ROM 14. The microprocessor 12 is energized by the output of a power supply circuit 16 during a power up cycle to place the meter in an operative condition. The microprocessor 12 transmits and receives signals over a data bus 18 coupled to the various meter components.

Generally, the microprocessor 12 transmits signals to and receives signals from the other electronic components 20, the keyboard 22 and the printer 24 for the actuation of stepper and bank motors and solenoids 26 to accomplish the printing of postage on a document. Each such postage printing operation or transaction is referred to as a trip cycle.

During each trip cycle, a certain amount of postage is used. A volatile random access memory 28, such as model 8155 with the appropriate input and output and timing circuits, contains an ascending register (AR), a descending register (DR) and appropriate cyclic redundancy codes (CRCs) and control sums. During each trip cycle and under control of the microprocessor 12 the descending register is decremented the appropriate amount for the postage used during the trip and the ascending register is incremented the appropriate amount for the postage used during the trip. Thus, the AR provides a running or current total of the amount of postage that has been used through completion of the last trip cycle and the DR provides a running or current total of the amount of postage remaining in the meter for subsequent use.

Also coupled to the data bus 18 to receive accounting data from the microprocessor 12 is a first NVM 30. Preferably, the first NVM 30 is a SEEQ 5516A electrically erasable read only memory (EEROM) having an endurance of 1 million write cycles. However, it should be understood that other NVMs which have high endurances may also be utilized, such as a battery backed CMOS integrated circuit chip or other similar integrated circuit chips. Under control of the microprocessor 12 the accounting data for each meter postage transaction, i.e., AR and DR, and other accounting data, as desired, is written into the first NVM 30, as well as the volatile RAM 28. Thus, a permanent updated record of the accounting data is maintained on-the-fly in real time in the first NVM 30.

A second NVM 32, such as an ER 3400 MNOS integrated circuit chip, is also electrically coupled to the data bus 18. Under control of the microprocessor 12, accounting data which is temporarily stored in the RAM 28 during each meter transaction is transferred from the RAM 28 and written into the second NVM 32, upon detection of a power down signal indicating commencement of a power down cycle.

During normal operation of the postage meter, the second NVM 32 is held in a non-write condition by the output signals from the microprocessor 12 over data bus 18. However, during a power failure (power down cycle), the microprocessor 12 initiates a power down cycle routine during which the power supply circuit 16 and a power down detection circuit 34 maintain the proper biases on the second NVM 32 to allow the transfer or writing of accounting data from the volatile RAM 28 into the second NVM 32. After completion of the transfer of this accounting data into the second NVM 32, the NVM 32 is disabled by the power down detection circuit 34 to prevent any further writing of data therein by the microprocessor 12.

The power supply circuit 16 and power down detection circuit 34 are preferably of the type disclosed in aforementioned U.S. Pat. No. 4,445,198. As disclosed in this patent, upon detection of a low power signal from the power supply circuit 16 the power down detection circuit 34 applies predetermined voltage bias signals to the second NVM 32 to allow the transfer of accounting data thereto from the RAM 28 under control of the microprocessor 12. Thereafter, the bias voltages are removed from the NVM 32 to disable the same and prevent any further writing therein from the microprocessor 12. Alternatively, the power supply circuit 16 and the power down detection circuit 34 may be of the type disclosed in copending patent application Ser. No. 489,971 filed Apr. 29, 1983, entitled, Non-Volatile Memory Protection Circuit With Microprocessor Interaction.

Further, during the power down cycle, the microprocessor 12 transmits signals to the power down protection circuit 36 over line 38 to disable the first NVM 30. Additionally, during the power down cycle a RESET signal is transmitted to the power down protection circuit 36 and the microprocessor 12 from the power supply circuit 16 over line 40 to clamp the first NVM 30 to ground potential and insure that no further writing in the first NVM 30 can occur as a result of any spurious signals from the microprocessor 12. Thus, the power down protection circuit 36 functions to inhibit any further writing in the first NVM 30 during a power down cycle.

Figure 2:
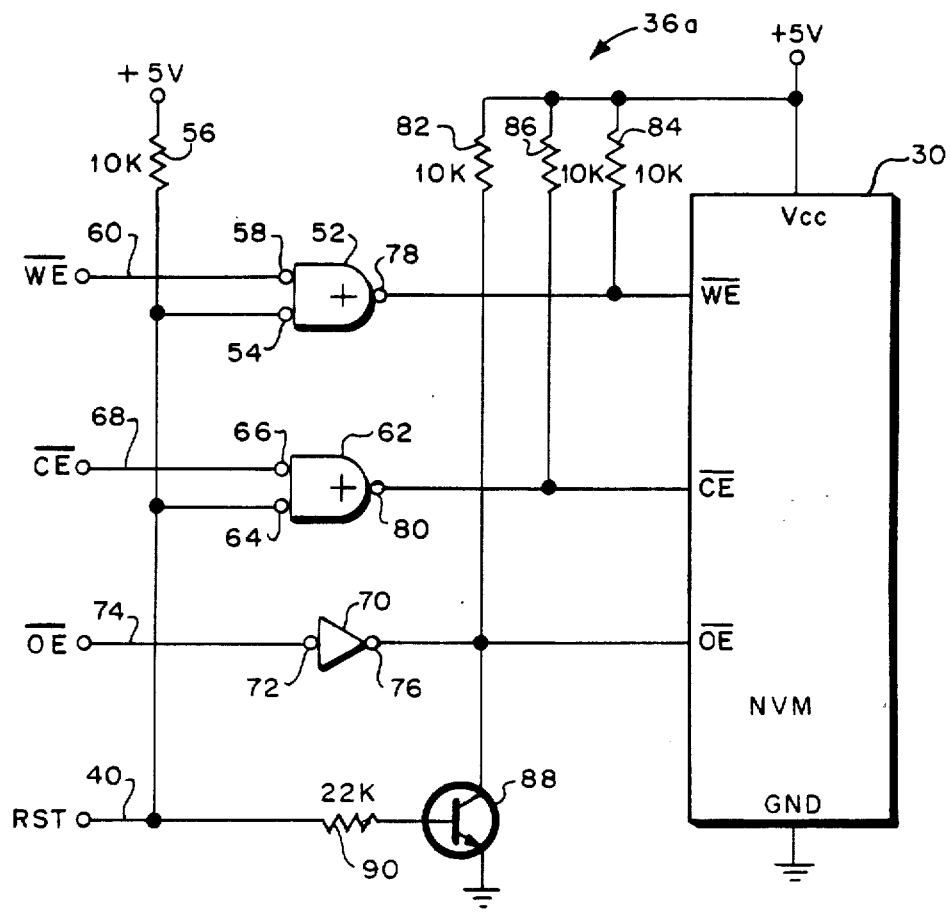
FIG. 2 is a schematic circuit diagram of a power down protection circuit in accordance with the present invention.

Referring to FIG. 2, a schematic circuit diagram of a power down protection circuit in accordance with the present invention is illustrated at 36A, shown electrically coupled to certain terminals or pins of the first NVM chip 30. The power down protection circuit 36A includes a first OR gate 52 having one input terminal 54 coupled to a +5 V output from the power supply circuit 16 through a pull up resistor 56, and its other input terminal 58 coupled to a WRITE ENABLE (WE) signal generated from the address and strobe lines of microprocessor 12 over line 60.

The power down protection circuit 36A also includes a second OR gate 62 which has one input terminal 64 coupled to the +5 V output from the power supply circuit 16 through the pull up resistor 56. The other input terminal 66 of the OR gate 62 is coupled to a CHIP ENABLE (CE) signal generated from the address and strobe lines of microprocessor 12 over line 68. The OR gates 52 and 62 also have their input terminals 54 and 64 coupled to the RESET (RST) terminal of the power supply circuit 16 over line 40, see also FIG. 1.

An open collector buffer 70, which is also part of the power down protection circuit 36A, has its input terminal 72 connected to an OUTPUT ENABLE (OE) signal generated from the address and strobe lines of microprocessor 12 over line 74 and its output terminal 76 coupled to the input terminal $\overline{OE}$ of the NVM 30. The OR gate 52 has its output terminal 78 coupled to the $\overline{WE}$ terminal of the NVM 30 and the OR gate 62 has its output terminal 80 coupled to the input terminal $\overline{CE}$ of the NVM 30.

The output terminal 76 of the open collector buffer 70 and the output terminals 78 and 80 of the OR gates 52 and 62, respectively, are normally pulled toward +5 volts by the +5 V output voltage from the power supply circuit 16 through pull up resistors 82, 84 and 86, respectively. The +5 V output signal from the power supply circuit 16 is also applied to terminal $V_{cc}$ of the NVM 30 and terminal GND of the NVM 30 is grounded.

The RESET line 40 from the power supply circuit 16 is also coupled to the output terminal 76 of the open collector buffer 70 through a switching transistor 88, shown as an NPN transistor. The RESET line 40 is coupled to the base of the transistor 80 through current limiting resistor 90. The emitter of the transistor 88 is grounded and the collector of the transistor 88 is electrically coupled to the output terminal 76 of the open collector buffer 70 and thus to the $\overline{OE}$ terminal of the NVM 30.

Figure 3:
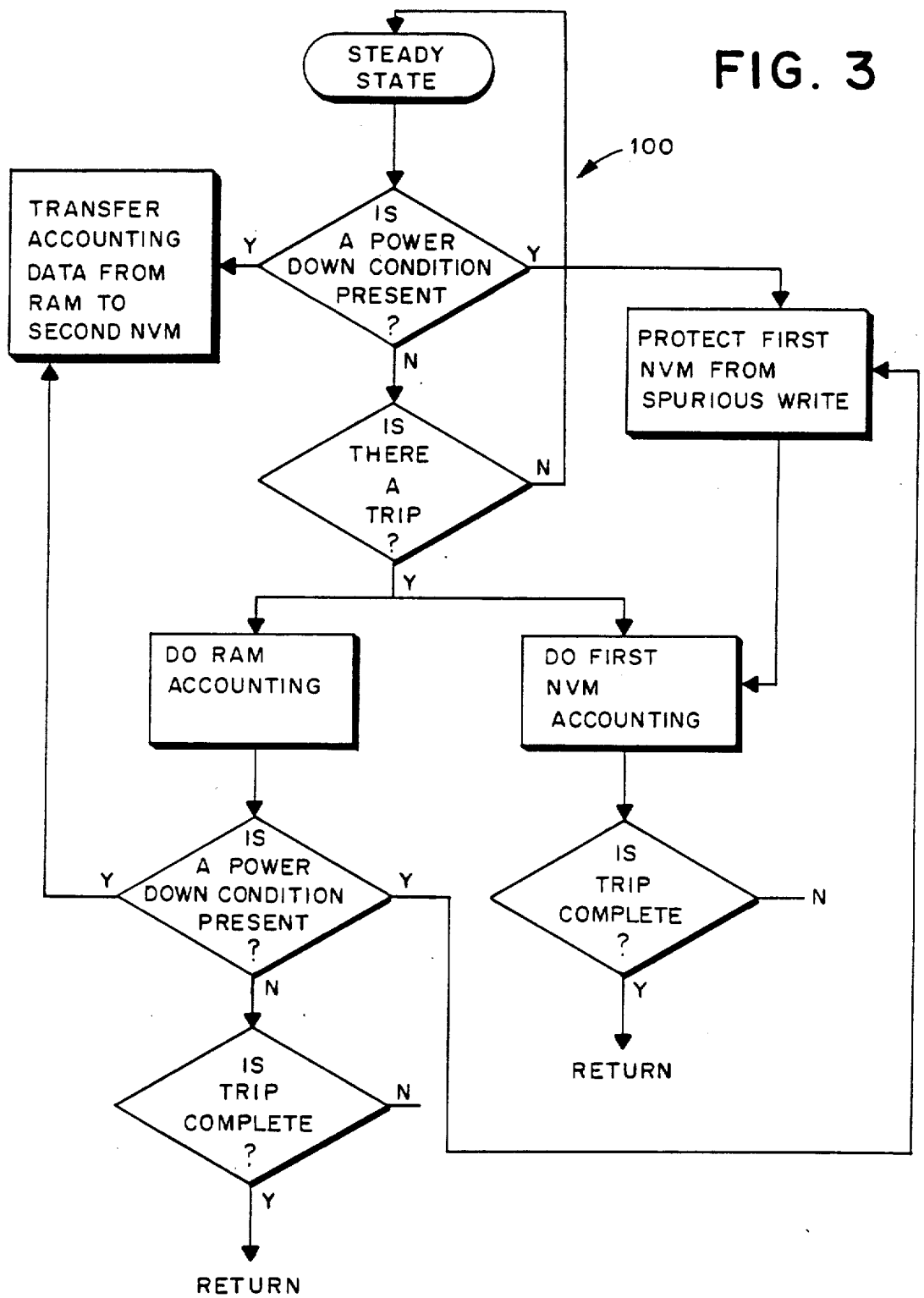
FIG. 3 is a flowchart illustrating the operation of the data protection system of the present invention.

A flowchart for the operation of the data protection system of the present invention with an electronic postage meter having multiple memories is illustrated in FIG. 3 at 100. Considering this flowchart 100 and the apparatus 10 illustrated in FIG. 1, after power up of the postage meter, prior to undertaking a transaction or commencing a trip cycle, the meter is in its quiescent or steady state condition. In this condition, if the microprocessor 12 senses a power down condition, i.e., power failure, the microprocessor 12 immediately transfers all the accounting data from the RAM 28 to the second NVM 32 by writing it into the second NVM 32. Thereafter, the power down detection circuit 34 disables the second NVM 32 to preclude any further writing of spurious data therein by erratic operation of the microprocessor 12 during the remainder of the power down cycle. After the transfer of accounting data from the RAM 28 the second NVM 32, the first NVM 30 disabled by the power down protection circuit 36 to prevent any further writing of spurious data therein by erratic operation of the microprocessor 12 during the remainder of the power down cycle when the voltages applied to the various circuit elements are degrading towards zero volts through unspecified and undefined bias conditions.

If no power down condition is present, the microprocessor 12 waits for a trip signal indicating that a trip cycle is being commenced. When a trip is present, the accounting data in the RAM 28 is updated to reflect the results of the most recent postage transaction or trip cycle. Likewise, accounting data for the postage transaction is written into the first NVM 30.

After writing the accounting data for the most recent transaction in RAM 28 and the first NVM 30, the microprocessor 12 looks for a power down condition. If such a condition is present, the previously described operation is undertaken to transfer accounting data from the RAM 28 into the second NVM 32 while at the same time preventing any further writing of data into the first NVM 30 during the unstable power conditions. If a power down condition is not present, the microprocessor 12 looks for a trip completion signal after writing the accounting data in the RAM 28 and first NVM 30. Upon detection of a trip completion signal, the meter returns to its steady state condition where the aforementioned process may be repeated.

Referring to FIG. 2, the operation of the power down protection circuit 36A is as follows. During power up of the postage meter a +5 V input is established at the $V_{cc}$ terminal of the NVM chip 30 by the power supply circuit 16 and the $\overline{WE}$ and $\overline{CE}$ terminals of the NVM 30 are held high and the $\overline{OE}$ terminal low in the presence of a RESET (true high) signal from the power supply circuit 16. That is the $\overline{WE}$ and $\overline{CE}$ terminals of the NVM 30 are held high and the $\overline{OE}$ terminal is held low due to the presence of a high signal (RESET) from the power supply circuit 16 on line 40 which provides a high signal at terminals 54 and 64 of the OR gates 52 and 62 and therefore at their output terminals 78 and 82, as well as a low signal at terminal 76 of the open collector buffer 70 since it is coupled to ground through conduction of the transistor switch 88. Thus, no data can be written into to first NVM 30 until removal of the RESET signal and the application of the proper signals $\overline{WE}$, $\overline{CE}$ and OE to the first NVM 30 from the microprocessor 12.

However, during a postage transaction or trip cycle the microprocessor 12 applies true low WE and CE signals and a true high OE signal to lines 60, 68 and 74, respectively, to enable the NVM 30 for writing therein. The RESET output from the power supply circuit 16 is normally inactive or low. Normally the input terminals 54 and 64 of the OR gates 52 and 62, respectively, are pulled toward +5 V by the resistor 56 so that they do not float. Likewise, the output terminals 76, 78 and 80 of the open collector buffer 76 and OR gates 52 and 62 are pulled toward +5 V by resistors 82, 84 and 86, respectively, so that they do not float.

In the presence of a true high OE signal, the open collector buffer 70 provides a true high signal OE at its output terminal 76 and therefore at terminal $\overline{OE}$ of the NVM 30. The OR gate 52 provides a true low signal $\overline{WE}$ at its output terminal 78 and at the $\overline{WE}$ terminal of the NVM 30 in the presence of a true low $\overline{WE}$ signal at the input terminal 58, since the RESET signal to terminal 54 is also low. Likewise, the OR gate 62 provides a true low signal $\overline{CE}$ at its output terminal 80 and at the $\overline{CE}$ terminal of the NVM 30 in the presence of a true low $\overline{CE}$ signal at the input terminal 66, since the RESET signal to terminal 64 is also low. With the $\overline{OE}$ terminal being high and the $\overline{CE}$ and $\overline{WE}$ terminals being low, a write cycle is initiated by the microprocessor 12 to write into the NVM 30.

Advantageously, when utilizing a SEEQ Model 5516A EEROM for the first NVM 30, during the power down cycle when $V_{cc}$ drops below +3 V an internal timing circuit prevents further writing into the NVM 30. However, the NVM 30 must be protected during the transition from +5 V to +3 V during the power down cycle. To ensure that no writing in the NVM 30 occurs during the power down cycle, once a predetermined voltage condition is sensed during the power down cycle, the microprocessor 12 provides high signals WE and CE on lines 60 and 68, respectively, and a low signal $\overline{OE}$ on line 74 to prevent writing in the NVM 30. However, since microprocessors may operate erratically and become active again below a predetermined voltage, e.g. +5 V, where they are thought to be inactive as disclosed in the aforementioned Pat. No. 4,445,198, and may possibly provide a combination of spurious signals on lines 60, 68 and 74 during such erratic operation which would activate NVM 30 for writing spurious signals therein, a RESET signal is advantageously provided to clamp the NVM 30 to ground potential. That is, the NVM 30 is quickly driven or clamped to a potential which is in the same direction as the falling potential being applied to the NVM 30 during the power down cycle.

When the unregulated voltage from the power supply circuit 16 drops below a specific predetermined voltage level an interrupt signal is transmitted to the microprocessor 12. Thereafter, the power supply circuit 16 transmits a RESET (true high) signal to the microprocessor 12 and the power down protection circuit 36A. This RESET signal (true high) is applied to the base terminal of the NPN transistor 88 causing the same to conduct so that the collector terminal and therefore the output terminal 76 of the open collector buffer 70 and therefore also terminal $\overline{OE}$ of the NVM 30 which is connected thereto are pulled towards ground potential. With terminal $\overline{OE}$ pulled to ground potential the NVM 30 is disabled and no data can be written therein. Further, the presence of the RESET signal at terminals 54 and 64 of the OR gates 52 and 62, respectively, causes their output terminals 78 and 80 to go high, preventing the outputs of the OR gates 52 and 62 from going low even in the presence of erratic $\overline{WE}$ and $\overline{CE}$ signals from the microprocessor 12.

From the foregoing description, it should be apparent that a data protection system for electronic postage meters having multiple non-volatile memories is provided in which a power down protection circuit prevents further writing into a real time NVM during a power down cycle in response to output signals from a microprocessor and in response to RESET signal from a power supply circuit which the power down protection circuit utilizes to clamp the real time NVM to a low potential which is advantageously in the same direction of falling potential as the power down cycle, here ground potential.

It should be understood for the purpose of the present application that the term postage meter refers to the general class of devices for the imprinting of a defined unit value for governmental or private carrier delivery of parcels, envelopes or other like applications for unit value printing. Thus, although the term postage meter is utilized, it is both known and employed in the trade as a general term for devices utilized in conjunction with services other than those exclusively employed by governmental postage and tax services. For example, private, parcel and freight services purchase and employ such meters as a means to provide unit value printing and accounting for individual parcels.

Further, it will be apparent to those skilled in the art that various modifications may be made in the present invention without departing from the spirit and scope thereof as described in the specification and defined in the appended claims.

What is claimed is:

1. A method of protecting the accounting data stored in an electronic postage meter having multiple non-volatile memories for the storage of accounting data, including the steps of:
   providing a first non-volatile memory;
   writing postage transaction accounting data into the first non-volatile memories in real time during each trip cycle of the meter;
   providing a second non-volatile memory;
   writing postage transaction accounting data into the second non-volatile memory only during the power down cycle of the meter; and
   disabling the first non-volatile memory when the meter enters a power down cycle to prevent any further writing of data into the first non-volatile memory.

2. The method recited in claim 1, including the step of:
   maintaining the second non-volatile memory in a condition which allows the writing of accounting data therein for only a predetermined time interval during the power down cycle.

3. The method recited in claim 1, including the step of:
   providing a reset signal to drive the first non-volatile memory towards ground potential during the power down cycle.

4. A system for protecting the accounting data stored in an electronic postage meter having multiple non-volatile memories for the storage of accounting data, comprising:
   a first non-volatile memory for storing transaction accounting data therein;
   microprocessor means for writing postage transaction accounting data into said first non-volatile memory in real time during each trip cycle of the meter;
   a second non-volatile memory for storing accounting data therein;
   said microprocessor means writing said transaction accounting data into said second non-volatile memory only during the power down cycle of the meter; and
   power down protection circuit means for disabling said first non-volatile memory when the meter enters a power down cycle to prevent any further writing of data into said first non-volatile memory.

5. The system recited in claim 4, including:
   power down detection circuit means for maintaining said second non-volatile memory in a condition which allows the writing of accounting data therein for only a predetermined time interval during the power down cycle.

6. The system recited in claim 4, including:
   reset signal means for providing a reset signal to drive said first non-volatile memory toward ground potential to prevent any further writing of data into said first non-volatile memory during the power down cycle.

7. The system recited in claim 4, wherein:
   said power down protection circuit means includes logic gate means for enabling said first non-volatile memory for the writing of accounting data therein in response to enabling signals and disabling said first non-volatile memory in response to disabling signals to prevent the further writing of data therein.

8. The system recited in claim 7, wherein:

said power down protection circuit means includes reset means coupled to said logic gate means to disable said first non-volatile memory to prevent any further writing therein in the presence of a reset signal.

9. The system recited in claim 8, wherein:

said first non-volatile memory is clamped to ground potential by said reset means in the presence of a reset signal to prevent the writing of data therein.

10. The system recited in claim 4, wherein:

said first non-volatile memory is a EEROM.

11. The system recited in claim 10, wherein:

said second non-volatile memory is an MNOS memory having accounting data written therein during the power down cyle of the meter.

12. The system recited in claim 4, wherein:

said power down protection circuit means includes logic gate means for applying enabling signals to the first non-volatile memory to allow accounting data to be written into the first non-volatile memory during each trip cycle of the meter and for applying disabling signals to the first non-volatile memory to prevent any data from being written into the first non-volatile memory during a power down cycle.

13. The system recited in claim 12, wherein:

the first non-volatile memory includes a write enable terminal, a chip enable terminal and an output enable terminal, said logic gate means being coupled to said terminals to allow the writing of accounting data therein only in response to the proper output signals from a microprocessor, said logic gate means disabling the terminals to prevent the writing of accounting data therein when the proper output signals from the microprocessor are not present;

said reset means includes switch means coupled to said output enable terminal to clamp said output enable terminal to ground potential and thereby prevent any further writing in the first non-volatile memory in the presence of a reset signal during the power down cycle of the meter.

14. The system recited in claim 13, wherein:

said reset means is coupled to said logic gate means to prevent activation of the write enable and chip enable terminals of said first non-volatile memory in the presence of a reset signal at the input of said reset means.

* * * * *